(12) United States Patent
Westwood

(10) Patent No.: US 8,497,233 B2
(45) Date of Patent: Jul. 30, 2013

(54) STRIPPING COMPOSITIONS FOR CLEANING ION IMPLANTED PHOTORESIST FROM SEMICONDUCTOR DEVICE WAFERS

(75) Inventor: Glenn Westwood, Edison, NJ (US)

(73) Assignee: Avantor Performance Materials, Inc., Center Valley, PA (US)

( * ) Notice: Subject to any disclaimer, the term of this patent is extended or adjusted under 35 U.S.C. 154(b) by 125 days.

(21) Appl. No.: 13/138,468

(22) PCT Filed: Feb. 18, 2010

(86) PCT No.: PCT/US2010/024529
§ 371 (c)(1),
(2), (4) Date: Aug. 22, 2011

(87) PCT Pub. No.: WO2010/099017
PCT Pub. Date: Sep. 2, 2010

(65) Prior Publication Data
US 2012/0028871 A1   Feb. 2, 2012

Related U.S. Application Data

(60) Provisional application No. 61/155,206, filed on Feb. 25, 2009, provisional application No. 61/232,800, filed on Aug. 11, 2009.

(51) Int. Cl.
*C11D 7/50* (2006.01)
*C11D 11/00* (2006.01)

(52) U.S. Cl.
CPC .................................. *C11D 11/0047* (2013.01)
USPC .......................................... 510/175; 510/176

(58) Field of Classification Search
CPC .................................................. C11D 11/0047
USPC .................. 510/175, 176; 134/1.3; 252/79.1
See application file for complete search history.

(56) References Cited

U.S. PATENT DOCUMENTS

| | | | | |
|---|---|---|---|---|
| 3,787,239 | A | 1/1974 | Schroeder et al. | 134/2 |
| 5,861,064 | A | 1/1999 | Oikari et al. | 134/6 |
| 5,972,862 | A | 10/1999 | Torii et al. | 510/175 |
| 6,030,932 | A | 2/2000 | Leon et al. | 510/175 |
| 6,107,202 | A | 8/2000 | Chiu et al. | 438/690 |
| 6,323,169 | B1 | 11/2001 | Abe et al. | 510/176 |
| 6,599,370 | B2 * | 7/2003 | Skee | 134/3 |
| 7,393,819 | B2 | 7/2008 | Hsu | 510/175 |
| 7,419,945 | B2 * | 9/2008 | Hsu | 510/175 |
| 7,521,406 | B2 * | 4/2009 | Hsu | 510/175 |
| 7,671,001 | B2 * | 3/2010 | Skee | 510/175 |
| 7,767,636 | B2 * | 8/2010 | Hsu | 510/175 |
| 8,044,009 | B2 * | 10/2011 | Kane et al. | 510/175 |
| 2001/0006936 | A1 | 7/2001 | Lee et al. | 510/175 |
| 2002/0077259 | A1 * | 6/2002 | Skee | 510/175 |
| 2003/0199407 | A1 | 10/2003 | Choi et al. | 510/176 |
| 2004/0011386 | A1 | 1/2004 | Seghal | 134/26 |
| 2004/0063042 | A1 | 4/2004 | Egbe | 430/329 |
| 2004/0149309 | A1 | 8/2004 | Hsu | 134/3 |
| 2004/0220065 | A1 | 11/2004 | Hsu | 510/175 |
| 2004/0229761 | A1 | 11/2004 | Kim | 510/175 |
| 2005/0003977 | A1 | 1/2005 | Itano et al. | 510/175 |
| 2005/0167284 | A1 | 8/2005 | Giri et al. | 205/703 |
| 2005/0176602 | A1 * | 8/2005 | Hsu | 510/175 |
| 2005/0176603 | A1 * | 8/2005 | Hsu | 510/175 |
| 2005/0209118 | A1 | 9/2005 | Kawamoto et al. | 510/175 |
| 2005/0227482 | A1 | 10/2005 | Korzenski et al. | 438/639 |
| 2005/0239673 | A1 * | 10/2005 | Hsu | 510/176 |
| 2006/0040838 | A1 | 2/2006 | Shimada et al. | 510/175 |
| 2006/0138399 | A1 | 6/2006 | Itano et al. | 257/40 |
| 2007/0060490 | A1 * | 3/2007 | Skee | 510/175 |
| 2007/0251551 | A1 | 11/2007 | Korzenski et al. | 134/41 |
| 2008/0169004 | A1 | 7/2008 | Wu | 134/2 |
| 2008/0171682 | A1 * | 7/2008 | Kane et al. | 510/176 |
| 2008/0269096 | A1 | 10/2008 | Visintin et al. | 510/176 |
| 2009/0107520 | A1 * | 4/2009 | Lee et al. | 134/2 |
| 2009/0163396 | A1 * | 6/2009 | Hsu | 510/176 |
| 2009/0192065 | A1 | 7/2009 | Korzenski et al. | 510/176 |
| 2010/0056410 | A1 | 3/2010 | Visintin et al. | 510/176 |
| 2010/0105595 | A1 * | 4/2010 | Lee | 510/176 |
| 2010/0261632 | A1 * | 10/2010 | Korzenski et al. | 510/175 |

FOREIGN PATENT DOCUMENTS

WO   WO 2006/107169 A1   10/2006

OTHER PUBLICATIONS

Patent Abstracts of Japan, Publication No. 01189921 A, Date of publication of application Jul. 31, 1989.
Patent Abstracts of Japan, Publication No. 2001051429 A, Date of publication of application Feb. 23, 2001.
Patent Abstracts of Japan, Publication No. 02018932 A, Date of publication of application Jan. 23, 1990.
Patent Abstracts of Japan, Publication No. 02103552 A, Date of publication of application Apr. 16, 1990.
Patent Abstracts of Japan, Publication No. 04287322 A, Date of publication of application Oct. 12, 1992.
Patent Abstracts of Japan, Publication No. 58132935 A, Date of publication of application Aug. 8, 1983.
Patent Abstracts of Japan, Publication No. 63222431 A, Date of publication of application Sep. 16, 1988.

* cited by examiner

*Primary Examiner* — Gregory Webb
(74) *Attorney, Agent, or Firm* — Hoffmann & Baron, LLP

(57) ABSTRACT

A composition for removal of high dosage ion implanted photoresist from the surface of a semiconductor device, the composition having at least one solvent having a flash point >65° C., at least one component providing a nitronium ion, and at least one phosphonic acid corrosion inhibitor compound, and use of such a composition to remove high dosage ion implanted photoresist from the surface of a semiconductor device.

18 Claims, No Drawings

STRIPPING COMPOSITIONS FOR CLEANING ION IMPLANTED PHOTORESIST FROM SEMICONDUCTOR DEVICE WAFERS

This Application is the US National Stage Application of PCT/US2010/024529 filed Feb. 18, 2010 and claiming priority from U.S. Provisional Application Nos. 61/155,206 filed Feb. 25, 2009 and 61/232,800 filed Aug 11, 2009.

FIELD OF THE INVENTION

This invention relates to a stripping composition and to the use of such stripping/cleaning composition in a method of cleaning implanted photoresist and wherein the composition is compatible with silicon, titanium, titanium nitride, tantalum, and tungsten. The stripping compositions of this invention are for removal of high energy/high dosage ion implanted bulk photoresist from the surface of semiconductor devices after the ion implantation steps and preventing etching of Si, Ti, TiN, W or Ta during the stripping process.

BACKGROUND TO THE INVENTION

Many ion implantation steps are performed throughout the fabrication of semiconductor devices, in particular during front end processing. During this process, a photoresist is used to mask off a region to be implanted, and ions are implanted into the desired implant region. The implant can be, for example, arsenic, boron, or phosphorus implants. The high energy ions used in these steps carbonize the photoresist crust, dehydrate and crosslink the photoresist and cause breakage of the photoresist ring structures, and leave inorganic material within the outer surface of the photoresist. This crust makes the photoresist extremely difficult to remove, especially in cases of high energy/high dosage implants such as used during source/drain implants. Implanted photoresist is usually removed from the surface using a combination of ashing followed by treatment with $H_2SO_4$ and $H_2O_2$. Mixtures of $H_2SO_4$ and $H_2O_2$ (SPM) have also been used without ashing. These processes are undesirable at newer technology nodes because they do not meet material loss requirements, do not completely remove the higher dose implanted photoresist, are time consuming processes, and require multiple steps. In the case of memory devices, the $H_2SO_4/H_2O_2$ chemistries are also undesirable because they are not compatible with tungsten. For high-$k$ metal gate devices, TiN, Ti, and Ta compatibility is very important, especially since current process, such as the afore-mentioned SPM process, are not compatible with these materials. There is therefore a need for improved stripping compositions for removal of high energy/high dosage ion implanted photoresist that are compatible with silicon and also with Ti, TiN, W or Ta during the stripping process.

SUMMARY OF THE INVENTION

The compositions of this invention are to strip such high energy and high dosage (>15 atoms/cm) ion implant photoresist from the surface of microelectronic devices after the ion implantation steps without etching of silicon, tungsten, titanium, titanium nitride, or tantalum. The compositions of this invention comprise, consist essentially of, or consist of (1) one or more solvents having a flash point of >65° C., preferably >110° C., and more preferably greater than 145° C. and still more preferably about 165° C., and most preferably sulfolane, (2) at least one component providing a nitronium ion, and (3) at least one phosphonic acid corrosion inhibitor compound. More preferably the compositions of this invention comprise, consist essentially of or consist of (1) from about 10 wt. % to about 94.99 wt. % solvent, (2) from about 5 wt. % to about 90 wt. % of at least one component capable of providing a nitronium ($NO_2^+$) ion, and (3) from about 0.01 wt. % to about 5.0 wt. % of at least one corrosion inhibitor which is a phosphonic acid compound. The component providing the nitronium ion may be (1) a solution containing a nitronium compound, or (2) may be provided by nitric acid or a nitrate that is to be mixed with an acid stronger than nitric acid (i.e., an acid having a lower pKa or higher Ka than nitric acid) to generate the nitronium ion from the nitric acid or the nitrate. Optionally, the composition may contain surfactants and metal chelating agents that are generally known in the art. The percentages are weight percent based on the total weight of (1) the solvent component, (2) the nitronium compound, or the strong acid/nitric acid or nitrate compound, and (3) the phosphonic acid corrosion inhibitor component.

DETAILED DESCRIPTION AND PREFERRED EMBODIMENTS

The solution containing a nitronium compound useful in the compositions of this invention may be a solution of any suitable nitronium compound. Among the suitable nitronium compounds there may be mentioned nitronium tetrafluoroborate ($NO_2BF_4$), nitronium perchlorate ($NO_2ClO_4$), nitronium fluorosulfate ($NO_2SO_3F$), nitronium triflate ($NO_2SO_2CF_3$) and the like. A solution of nitronium tetrafluoroborate is preferred as the nitronium compound to provide the nitronium ion.

Any suitable compound providing a nitronium ion when mixed with an acid stronger than nitric acid may be employed in the compositions of this invention. Among such compounds suitable for providing such nitronium ions are nitric acid and nitrates. Any suitable nitrate may be employed, such as for example, a tetraalkylammonium nitrate, potassium nitrate, sodium nitrate and the like. Nitric acid is generally preferred. The nitronium ion is generated, for example, in situ for this purpose, such as by mixing the strong acid (i.e., an acid having a lower pKa or higher Ka than nitric acid), e.g., sulfuric acid, and nitric acid according to the equilibrium $$2H_2SO_4 + HNO_3 \Leftrightarrow 2HSO_4^- + NO_2^+ + H_3O_+$$

Any suitable acid stronger than nitric acid may be employed as the acid along with the nitric acid or nitrate compound to provide the nitronium ion for the compositions of this invention. As examples of such acids stronger than nitric acid there may be mentioned, for example, sulfuric acid, triflic acid, tetrafluoroboric acid and the like. The weight ratio of such strong acid to the remaining components of the composition, namely the solvent, nitric acid or nitrate, and phosphonic acid corrosion inhibitor is a ratio of strong acid/remaining components of from about 20:1 to about 1:10, preferably at a ratio of strong acid/formulation of from about 10:1 to about 1:10 and more preferably at a ratio of strong acid/remaining components of about 9:2 to 1:5; still more preferably at a ratio of 9:2.

Any suitable phosphonic acid corrosion inhibitor may be employed in the compositions of this invention. Among suitable phosphonic acid corrosion inhibitors there may be mentioned, for example, aminotrimethylenephosphonic acid, diethylenetriam inepenta(methylenephosphonic acid) (DETPA), N,N,N',N'-ethylenediaminetetra(methylenephosphonic) 1,5,9-triazacyclododecane-N,N',N'''-tris(methylenephosphonic acid) (DOTRP), 1,4,7,10-tetranzacyclododecane-N,N 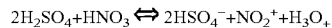 N'',N'''-tetrakis (methylenephosphonic acid) (DOTP), nitrilotris(methylene) triphosphonic acid, diethylenetriaminepenta(methylenephosphonic acid) (DETAP), aminotri(methylenephosphonic acid), 1-hydroxyethylene-1,1-diphosphonic acid, bis(hexamethylene)triamine phosphonic acid, 1,4,7-triazacyclononane-N,N',N"-tris(methylenephosphonic acid) (NOTP) and the like. Preferably the phosphonic acid corrosion inhibitor is aminotrimethylenephosphonic acid. If necessary a minimal amount of water, generally less than about 5% by weight based on the total weight of the composition, may be employed with the phosphonic acid corrosion inhibitor to enhance the solubility thereof. However, it is preferred that no water be employed.

The composition may employ at least one or more of any suitable solvent that has a flash point higher than 65° C., preferably higher than 110° C., more preferably higher than 145° C., and most preferably about 165° C. or above, and that is compatible with strong acids. Examples of suitable solvents for use in the compositions of this invention include but are not limited to, the following exemplary solvents, 3-amino-1-propanol, butyl benzoate, dimethyl sulfoxide, ethylhexylacetate, hexanoic acid, isophorone, methylaniline, nitrobenzene, oxetanone, phenylhydrazine, propanediol, salicylaldehyde, tetrahydronaphthalene, tetramethylurea, trichloropropane, trimethylphosphate, and undecane having flash points between 65° C. and 109° C., chloronaphthalene, dibenzylether, diethylmaleate, pentanediol, phenoxyethanol, propylene carbonate, tetradecane, and triethylphosphate having flash points between 110° C. and 144° C., dibutyl sebacate, dimethylphthalate, glycerol, sulfolane and triethyleneglycol having flash points of >145° C. The at least one solvent is preferably sulfolane.

In an embodiment of the invention the stripping composition's effective cleaning of the ion implanted photoresist occurs upon contact of the photoresist with a composition of this invention at any time and temperature suitable for removal of the ion implanted photoresist. Generally such cleaning will occur at a temperature of from about 65° C. to about 160° C. and over a period of time ranging up to about 40 minutes, but generally is less than about 2 minutes depending upon the particular composition utilized and the particular ion implanted photoresist to be removed. Those skilled in the art will readily determine the time and temperature based on the particular composition employed and the manner in which it is employed, as well as the ion dosage and implant energy employed in the implanting process.

A particularly preferred formulation of this invention is one containing about 49.75 wt. % sulfolane, about 49.75 wt. % nitric acid (70%), and about 0.50 wt. % aminotrimethylenephosphonic acid. This formulation is mixed with an acid stronger than nitric acid, preferably with sulfuric acid, in a weight ratio of sulfuric acid to remaining components of the composition of about 9:2.

A preferred embodiment of this invention is where the solvent, strong acid if employed, and optionally the phosphonic acid corrosion inhibitor is heated to a temperature of above the desired stripping temperature of this invention and then a nitronium compound or nitric acid or nitrate compound of this invention is added to the heated components just before the stripping operation is to occur. The nitronium compound or nitric acid or nitrate compound to be added to the heated components acid will generally be maintained at a temperature of about room temperature before its addition to the heated components. Optionally the phosphonic acid corrosion inhibitor and/or solvent may be employed with the nitronium compound or nitric acid or nitrate compound instead of being heated with the strong acid. Heating of the nitronium compound or nitric acid or nitrate compound to a temperature of >100° C. prior to its mixing with the solvent or solvent and strong acid can cause significant undesirable loss of striping performance of the resulting composition of this invention. Moreover, at temperatures needed for the cleaning process to occur the mixture of all the required components in one solution is very unstable and thus no appreciable storage time of the complete composition should occur before it use.

One method of obtaining the compositions of this invention without requiring any appreciable storage time for the completed composition before its use is to maintain two or more vessels with certain of the components of the compositions wherein the vessels are connected in a manner that the components of the vessels are combined, i.e. mixed together, just before their use as a stripper/cleaner of microelectronic devices. More particularly, the composition of this invention may be formed wherein at least one or more of the solvent, the acid stronger than nitric acid, and the phosphonic acid corrosion inhibitor components has been heated to a temperature above the temperature to be used for cleaning ion implanted photoresist, and the composition is formed by mixing the heated component(s) with the nitric acid nitrate component that has been maintained at a temperature of about room temperature or heated to a temperature of below 100° C., preferably about 25° C. Especially preferred is where the composition is formed by mixing all the components of the composition together at a time of about 5 minutes or less before the composition is to be used as a cleaner of high dosage ion implanted photoresist from the surface of a semiconductor device. One such apparatus for doing the same would comprise several, vessels connected via lines to a spray apparatus wherein the components of the vessels are combined just before the spray head of the spray apparatus. The various vessels may have the component or components of the composition in heated or unheated form as required. For example, a first vessel may contain the strong acid maintained at a temperature of about 165° C., a second vessel of the solvent and the corrosion inhibitor at about 110° C., and a third vessel with nitric acid at about 25° C. In another embodiment a first vessel may contain most of the strong acid at a temperature of about 165° C., a second vessel of the solvent and a small portion of the strong acid, the corrosion inhibitor, and water at a temperature of about 110° C., and a third vessel nitric acid at a temperature of about 25° C. Another embodiment comprises a first vessel containing the solvent and the strong acid heated to a temperature of about 165° C. and a second vessel containing nitric acid and phosphonic acid corrosion inhibitor at room temperature. In general, all the components are heated to an appropriate temperature so that upon mixing the desired use (stripping) temperature is obtained. In general the components of the vessels in the various possible embodiments are mixed within about 5 minutes of their use in the cleaning process, and the temperature of the mixed components is in the range of about 145° C. to about 165° C. The temperature employed will depend upon the components of the composition and ion dosage and ion implant energy employed in obtaining the implanted bulk photoresist.

Generally any possible combination of vessel components are possible provided the strong acid (e.g., sulfuric acid) and nitric acid or nitrate are not in the same vessel and the nitric acid or nitrate acid is generally not heated to above about 100° C., preferably not above about 25° C. It is an aspect of this invention that not all components are heated to the cleaning temperature. It is only necessary that the various components are heated to a point where upon mixing, the temperature of the resulting mixture reaches the desired cleaning temperature. Exemplary, but not limited to, are the following examples of vessels of components that may be employed by connecting to a spraying apparatus for use in the cleaning process of this invention.

Example 1

The preferred example is a mixture of 3 solutions as follows.
Vessel 1—25% Sulfuric Acid at 165° C.;
Vessel 2—44% Solvent (Sulfolane), 4% Sulfuric Acid, 2% corrosion inhibitor (Aminotrimethylenephosphonic acid) at 110° C.; and
Vessel 3—25% Nitric Acid at 25° C.
The components of the three vessels are mixed within 5 minutes of cleaning the wafer of interest. The mixed temperature is about 145°-165° C. The wafer is cleaned for 0.5 to 5 minutes depending on ion dosage and ion implant energy. Compatible with W (<0.1 Å/min.), TiN (1.4 Å/min.), and Ta (<0.1 Å/min.).

Example 2

Another preferred 3 solution mixture is as follows. Water is added to keep corrosion inhibitor in solution during extended storage.
Vessel 1—25% Sulfuric Acid at 165° C.;
Vessel 2—40% Solvent (Sulfolane), 3.64% Sulfuric Acid, 1.82% corrosion inhibitor (Aminotrimethylenephosphonic acid), and 4.54% water at 110° C., and
Vessel 3—25% Nitric Acid at 25° C.
The three solutions are mixed within 5 minutes of cleaning the wafer of interest. The mixed temperature is about 145°-165° C. The wafer is cleaned for 0.5 to 5 minutes depending on ion dosage and ion implant energy.

Example 3

Another preferred 3 solution embodiment is as follows.
Vessel 1—20% Sulfuric Acid at 165° C.,
Vessel 2—64% Solvent (Sulfolane), 4.0% Sulfuric Acid, 2.0% corrosion inhibitor (Aminotrimethylenephosphonic acid), at 110° C., and
Vessel 3—10% Nitric Acid at 25° C.
The 3 solutions are mixed within 5 minutes of cleaning the wafer of interest. The mixed temperature is about 145°-165° C. The wafer is cleaned for 0.5 to 5 minutes depending on ion dosage and ion implant energy. Compatible with TiN (0.21 Å/min.)

Example 4

Another preferred 3 solution embodiment is as follows.
Vessel 1—10% Sulfuric Acid at 165° C.,
Vessel 2—64% Solvent (Sulfolane), 4.0% Sulfuric Acid, 2.0% corrosion inhibitor (Aminotrimethylenephosphonic acid), and 4.54% water at 110° C., and
Vessel 3—20% Nitric Acid at 25° C.
The 3 solutions are mixed within 5 minutes of cleaning the wafer of interest. The mixed temperature is about 145°-165° C. The wafer is cleaned for 0.5 to 5 minutes depending on ion dosage and ion implant energy. Compatible with TiN (<0.10 Å/min.)

Example 5

Another preferred 2 solution embodiment is as follows.
Vessel 1—26% Sulfuric Acid, 44% Sulfolane (165° C.), and
Vessel 2—26% HNO3, 4% corrosion inhibitor (Aminotrimethylenephosphonic acid) at room temperature.
The 3 solutions are mixed within 5 minutes of cleaning the wafer of interest. The mixed temperature is about 145°-165° C. The wafer is cleaned for 0.5 to 5 minutes depending on ion dosage and ion implant energy. Compatible with TiN (1.38 Å/min.)

The stripping and non-corrosive performance of compositions of this invention is illustrated by, but not limited to, the following test results utilizing the following composition of this invention. The composition of this invention employed in the tests was a composition formed by mixing (1) a room temperature formulation containing about 49.75 wt. % sulfolane, about 49.85 wt. % nitric acid (70%), and about 0.50 wt. % aminotrimethylenephosphonic acid with (2) sulfuric acid heated to the stripping temperature in a weight ratio of sulfuric acid to remaining components of the composition of about 9:2. Arsenic, phosphorus and boron ion implanted wafers were immediately treated with the compositions solution for a period of about 2 to 3 minutes. Cleaning was determined by optical microscopy and SEM. The results were as set forth in Table 1.

TABLE 1

| Dosage | <5 keV Implant Energy | 5-20 keV Implant Energy | 20-50 keV Implant Energy |
|---|---|---|---|
| $1 \times 10^{14} - 1 \times 10^{15}$ atoms/cm$^2$ | Clean at 90° C. | Clean at 140° C. | Clean at 140° C. |
| $1 \times 10^{15} - 5 \times 10^{15}$ atoms/cm$^2$ | | Clean at 140° C. | Almost Clean at 140° C. |
| $5 \times 10^{15} - 1 \times 10^{16}$ atoms/cm$^2$ | | | Partially Clean at 140° C. |

The cleaning obtained with the composition of this invention is comparable to that obtained with SPM but without the corrosion encountered with SPM cleaning.

Table 2 describes the mixture of $H_2SO_4$ with sulfolane/nitric acid that is optimized for performance. Cleaning of ion implanted photoresist was done on high dose implanted wafers ($5 \times 10^{15} - 1 \times 10^{16}$ atoms As/cm$^2$, 10 keV). Components were all mixed together and then heated. Ion implanted photoresist wafers were cleaned with these formulations at 85° C. for 40 minutes and the cleaning performance was given a score of 0 or 1 (1 is clean and 0 is not clean at all). The data in this Table 2 indicates that >50% $H_2SO_4$ is necessary in the mixture for the best cleaning performance. In addition to this, nitric acid is necessary for cleaning.

TABLE 2

| $H_2SO_4$ | Sulfolane | $HNO_3$ | Cleaning Score |
|---|---|---|---|
| 0 wt. % | 50 wt. % | 50 wt. % | 0.50 |
| 25 wt. % | 25 wt. % | 50 wt. % | 0.25 |
| 25 wt. % | 50 wt. % | 25 wt. % | 0.25 |
| 50 wt. % | 00 wt. % | 50 wt. % | 0.50 |
| 50 wt. % | 25 wt. % | 25 wt. % | 0.75 |
| 50 wt. % | 50 wt. % | 0 wt. % | 0.10 |

Etch rate data for possible etching of W, Ti, TiN and Ta was obtained for a composition of this invention formed by mixing (1) a room temperature formulation containing about 49.75 wt. % sulfolane, about 49.75 wt. % nitric acid (70%), and about 0.50 wt. % aminotrimethylenephosphonic acid with (2) sulfuric acid heated to the stripping temperature of 65° C., 90° C. and 140° C., in a weight ratio of sulfuric acid to remaining components of the composition of about 9:2. The results of the etch rates for this composition of the invention was compared to the etch rates for SPM (5 parts by wt. heated $H_2SO_4$/1 part by wt. room temperature $H_2O_2$ added to the heated $H_2SO_4$) at the same cleaning temperatures. Metal pieces of the test metals were immediately submerged in the formed test compositions to treat for etch rates. Etch rates (in Angstrom/min.) were determined using a four point probe to measure thickness. These results in Table 3 show that for low temperature cleans, the stripping composition of this invention showed better metal compatibility for all those metals tested than the metal compatibility obtained with SPM. At elevated temperature, the composition of this invention showed improved metal compatibility for W and Ta.

TABLE 3

| | 65° C. cleaning temp. | | 90° C. cleaning temp. | | 140° cleaning temp. | |
|---|---|---|---|---|---|---|
| Metal | Inventive Composition | SPM | Inventive Composition | SPM | Inventive Composition | SPM |
| W | <1 Å/min. | >75 Å/min | <1 Å/min | >75 Å/min | <1 Å/min | >75 Å/min |
| Ti | 7.67 Å/min | >140 Å/min | >140 Å/min | >140 Å/min | >140 Å/min | >140 Å/min |
| TiN | 4.31 Å/min | >40 Å/min | 10.5 Å/min | >40 Å/min | >40 Å/min | >40 Å/min |
| Ta | <1 Å/min | <1 Å/min | <1 Å/min | 2.2 Å/min | <1 Å/min | 18 Å/min |

The sulfolane and the phosphonic acid corrosion inhibitor are required in the formulation to provide low TiN etch rates. All etch rates were determined for compositions wherein $H_2SO_4$ was heated to 85° C., then the other components of the formulation, at room temperature, were added. Etch rates were measured over 2 min. Table 4 show TiN etch rates for different versions of the nitric acid containing formulation of this invention/$H_2SO_4$ mixtures. It is clear that both sulfolane and the phosphonic acid corrosion inhibitor are necessary to maintain a low TiN etch rate. In comparison, SPM shows an unacceptable etch rate of >150 Å/min for TiN when mixed at 85° C.

TABLE 4

| $H_2SO_4$ | $HNO_3$ | Sulfolane | Aminotrimethylene-phosphonic acid | TiN etch rate (Å/min.) |
|---|---|---|---|---|
| 81.7 wt. % | 9.1 wt. % | 9.1 wt. % | 0.1 wt. % | 11.66 |
| 90.8 wt. % | 9.1 wt. % | 0 wt. % | 0.1 wt. % | 30.85 |
| 81.8 wt. % | 9.1 wt. % | 9.1 wt. % | 0.0 wt. % | 16.60 |
| 90.9 wt. % | 9.1 wt. % | 0.0 wt. % | 0.0 wt. % | 65.19 |

Compatibility of Si etching was determined by treating a silicon film for 5 min. with a composition formed by mixing (1) a room temperature formulation containing about 49.75 wt. % sulfolane, about 49.75 wt. % nitric acid (70%), and about 0.50 wt. % aminotrimethylenephosphonic acid with (2) sulfuric acid heated to the stripping temperature of 140° C. in a weight ratio of sulfuric acid to remaining components of the composition of about 9:2. This process was repeated for the same wafer piece 20 times. After these treatments there was no measurable etching of silicon as measured by cross-section SEM.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

The invention claimed is:

1. A composition for removal of high dosage ion implanted photoresist from the surface of a semiconductor device, the composition comprising:
   at least one solvent having a flash point of >65° C.,
   at least one component providing a nitronium ion, and
   at least one phosphonic acid corrosion inhibitor compound.

2. A composition according to claim 1 wherein the at least one solvent is sulfolane.

3. A composition of claim 1 wherein the at least one component providing a nitronium ion is a nitronium compound selected from the group consisting of nitronium tetrafluoroborate ($NO_2BF_4$), nitronium perchlorate ($NO_2ClO_4$), nitronium fluorosulfate ($NO_2SO_3F$), and nitronium triflate ($NO_2SO_2CF_3$).

4. A composition according to claim 1 wherein the phosphonic acid corrosion inhibitor compound is selected from the group consisting of aminotrimethylenephosphonic acid, diethylenetriaminepenta(methylenephosphonic acid) (DETPA), N,N,N',N'-ethylenediaminetetra(methylenephosphonic) 1,5,9-triazacyclododecane-N,N',N'''-tris(methylenephosphonic acid) (DOTRP), 1,4,7,10-tetrazacyclododecane-N,N',N'',N'''-tetrakis(methylenephosphonic acid) (DOTP), nitrilotris(methylene) triphosphonic acid, diethylenetriaminepenta(methylenephosphonic acid) (DETAP), aminotri(methylenephosphonic acid), 1-hydroxyethylene-1,1-diphosphonic acid, bis(hexamethylene)triamine phosphonic acid, and 1,4,7-triazacyclononane-N,N',N''-tris(methylenephosphonic acid) (NOTP).

5. A composition according to claim 1 wherein the at least one solvent is sulfolane, the nitronium compound is nitronium tetrafluoroborate, and the phosphonic acid corrosion inhibitor compound is aminotrimethylenephosphonic acid.

6. A composition according to claim 1 wherein the solvent is sulfolane and is present in an amount of from about 10 wt. % to about 94.99 wt. %, the at least one component providing a nitronium ion is present in an amount of from about 5 wt. % to about 90 wt. %, and the at least one phosphonic acid corrosion inhibitor is present in an amount of from about 0.01 wt. % to about 5.0 wt. % wherein the wt. percents are based on the total combined weight of the sulfolane, nitronium ion providing component, and phosphonic acid corrosion inhibitor compound.

7. A composition according to claim 1 comprising:
   at least one solvent having a flash point >65° C.,
   at least one component providing a nitronium ion and selected from the group consisting of nitric acid and a nitrate,
   at least one phosphonic acid corrosion inhibitor, and
   an acid stronger than nitric acid.

8. A composition according to claim 7 wherein the solvent is sulfolane.

9. A composition according to claim 7 wherein the acid stronger than nitric acid is selected from the group consisting of sulfuric acid, triflic acid, and tetrafluoroboric acid.

10. A composition according to claim 7 wherein the at least one component providing a nitronium ion is nitric acid.

11. A composition according to claim 7 wherein the phosphonic acid corrosion inhibitor compound is selected from the group consisting of aminotrimethylenephosphonic acid, diethylenetriaminepenta(methylenephosphonic acid) (DETPA), N,N,N',N'-ethylenediaminetetra(methylenephosphonic) 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), nitrilotris(methylene) triphosphonic acid, diethylenetriaminepenta(methylenephosphonic acid) (DETAP), aminotri(methylenephosphonic acid), 1-hydroxyethylene-1,1-diphosphonic acid, bis(hexamethylene)triamine phosphonic acid, and 1,4,7-triazacyclononane-N,N',N''-tris(methylenephosphonic acid) (NOTP).

12. A composition according to claim 7 wherein the at least one solvent is sulfolane, the acid stronger than nitric acid is sulfuric acid, the phosphonic acid corrosion inhibitor compound is aminotrimethylenephosphonic acid, and the at least one component providing a nitronium ion is nitric acid.

13. A composition according to claim 7 wherein the weight ratio of the acid stronger than nitric acid to the remaining components of the composition is from about 20:1 to 1:10.

14. A composition according to claim 13 wherein the acid stronger than nitric acid is sulfuric acid and the weight ratio of sulfuric acid/remaining components of the composition is from about 9:2.

15. A composition according to claim 7 comprising:
about 49.75 wt % sulfolane, about 49.75 wt. % nitric acid (70%), and about 0.50 wt. % aminotrimethylenephosphonic acid,
said components being mixed with sulfuric acid in a weight ratio of sulfuric acid to said components of about 9:2.

16. A composition according to claim 7 wherein at least one or more of the solvent, the acid stronger than nitric acid, and the phosphonic acid corrosion inhibitor components has been heated to a temperature above a temperature to be used for cleaning ion implanted photoresist, and the composition is formed by mixing the heated component(s) with the nitronium ion providing component that has been maintained at a temperature of about room temperature.

17. A composition according to claim 16 wherein the composition is formed by mixing all the components of the composition together at a time of about 5 minutes or less before the composition is to be used as a cleaner of high dosage ion implanted photoresist from the surface of a semiconductor device.

18. A process for the removal of high dosage ion implanted photoresist from the surface of a semiconductor device, the process comprising contacting the high dosage ion implanted photoresist with a composition of claim 1 for a time and temperature sufficient to remove the photoresist.

* * * * *